United States Patent [19]

Frederiksen et al.

[11] 3,958,267
[45] May 18, 1976

[54] CURRENT SCALING IN LATERAL PNP STRUCTURES

[75] Inventors: Thomas M. Frederiksen, San Jose; James L. Dunkley, Santa Clara, both of Calif.

[73] Assignee: National Semiconductor Corporation, Santa Clara, Calif.

[22] Filed: June 5, 1975

[21] Appl. No.: 583,882

Related U.S. Application Data

[63] Continuation of Ser. No. 358,068, May 7, 1973, abandoned.

[52] U.S. Cl.................................. 357/36; 357/40; 357/46
[51] Int. Cl.².................... H01L 29/72; H01L 27/02
[58] Field of Search......................... 357/36, 46, 40

[56] References Cited
UNITED STATES PATENTS

| | | | |
|---|---|---|---|
| 3,173,069 | 3/1965 | Stehney | 357/36 |
| 3,579,059 | 5/1971 | Widlar | 357/36 |
| 3,633,052 | 1/1972 | Hanna | 357/36 |

OTHER PUBLICATIONS

IBM – Tech. Disc. Bull. – Vol. 14, No. 5, Oct. 1971 – Berger pp. 1422–1423.

*Primary Examiner*—Edward J. Wojciechowicz
*Attorney, Agent, or Firm*—Lowhurst & Aine

[57] ABSTRACT

Current scaling in a lateral transistor wherein a plurality of emitter-collector circuits are established, certain of said circuits having a different base width than certain other of said circuits. In one embodiment, separate transistors are formed, each with its own emitter and collector, each portion of each collector being spaced an equal distance from its associated emitter the base widths of the different transistors being different, such that, with the emitters coupled in common, different currents being dependent on the base width of the associated transistor. In a second embodiment, a common emitter is employed with the separate collectors formed as arcs about the emitter, the base widths between the emitter and the different collectors being different.

8 Claims, 6 Drawing Figures

U.S. Patent   May 18, 1976   3,958,267
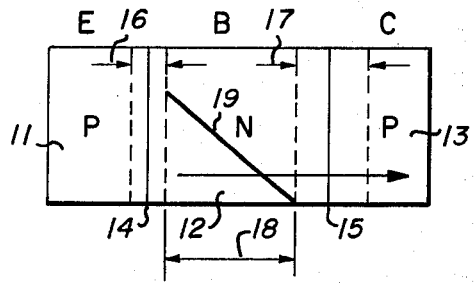
Fig_1
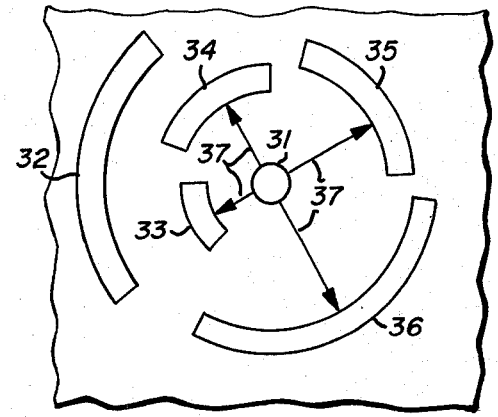
Fig_4
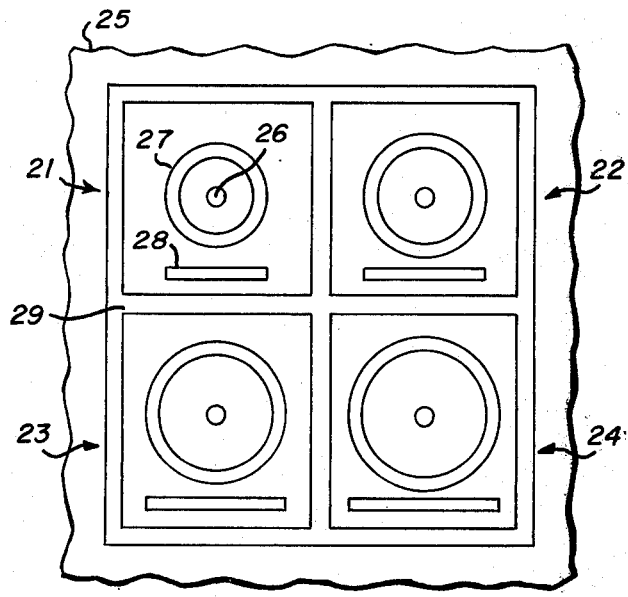
Fig_2
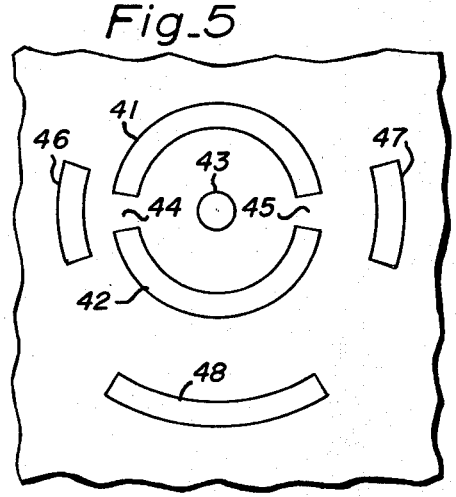
Fig_5
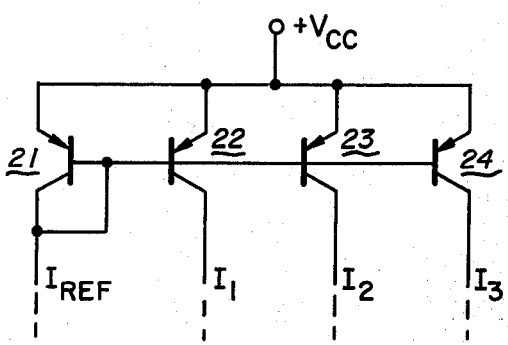
Fig_3
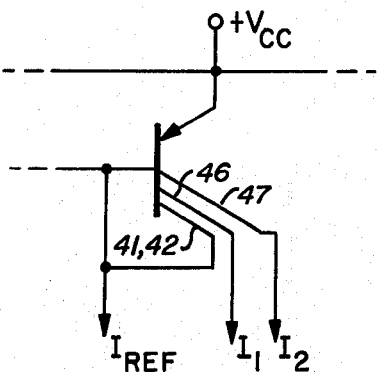
Fig_6

CURRENT SCALING IN LATERAL PNP STRUCTURES

This is a continuation of application Ser. No. 358,068, filed May 7, 1973, now abandoned.

BACKGROUND OF THE INVENTION

It is known in the art of integrated circuitry that current scaling, i.e. the provision of a plurality of current paths where the currents flowing therein are divided into some predetermined ratio, can be obtained. These techniques include emitter area scaling, using unequal emitter resistors with common bias voltage and also collector segmenting (i.e. multiple collectors of different areas). Collector segmenting is described in U.S. Pat. No. 3,579,059 issued to Robert J. Widlar on May 18, 1971 where collectors of different size, or having different effective junction lengths opposite the emitter-base region, provide controlled current splitting among a plurality of separate collectors. Thus this multiple collector transistor can be utilized as a current source to feed a number of different circuits in an integrated circuit. With such known techniques it is difficult if not impossible to get current ratios of 10:1 and higher.

SUMMARY OF THE PRESENT INVENTION

The present invention provides a different mode of current scaling in a lateral transistor which employs base width scaling, resulting in very large current ratios in certain embodiments of the invention, e.g. 2000:1. The fundamental principle of base width scaling makes use of two facts; one is that, in a diffusion transistor, the collector current which results from a given emitter-base "on" voltage is related to the effective base width. Secondly, the effective base width of a lateral transistor in an integrated circuit can be dictated by the surface layout geometry. By spacing one collector a substantial distance from its associated emitter relative to the spacing of another collector from its associated emitter, such that the base width between the emitter and said one collector is substantially greater than the base width between the emitter and said other collector, for a given emitter-base voltage the current flow from the associated emitter to said one collector is substantially less than the current flow from the associated emitter to said other collector.

In one embodiment of the present invention, a plurality of separate lateral transistors are formed on a substrate with the base width, i.e. the spacing between emitter and collector, for one or more transistors being greater than the base width for another transistor. With predetermined base width spacings and with a common emitter-base voltage for the transistors, the current flowing through each of the separate emitter-collector paths will be in some known ratio. Also, with one of the transistors provided with a collector to base short, the current flowing through this transistor can be utilized as a reference current to which the other emitter-collector current may be referenced.

In another embodiment of the present invention, a common emitter is located at a central axis position and separate collectors are spaced radially from this emitter. Each collector is in the form of an arc, the separate collectors being spaced radially from the emitter a distance dependent on the desired amount of emitter current to flow through each separate collector. Where one collector is to pass less current than another collector, said one collector is spaced radially a greater distance from the emitter than said other collector.

In one form of said other embodiment of this invention, one collector is formed in an arc extending substantially in a full circle about the emitter with a gap being left between the two ends of the arc. A second collector is positioned a greater radial distance from the emitter and in alignment with the gap in the first collector. This particular aperture limited pattern allows current ratios between the near in collector and the further removed collector to reach large values such as 2000:1. Such a transistor can comprise two near in collectors with two gaps therein, and two further removed collectors aligned with the two gaps.

BRIEF DESCRIPTION OF THE DRAWINGS

FIG. 1 is a simplified model of a forward active transistor illustrating the base width effect utilized in the present invention.

FIG. 2 is a plan view of one embodiment of the present invention showing four lateral transistors with varying base widths.

FIG. 3 is a schematic diagram showing one circuit configuration of the structure of FIG. 2.

FIG. 4 is a plan view of a second embodiment of the present invention which combines variable base width with collector segmenting.

FIG. 5 is a further embodiment of the present invention employing an aperture limited structure.

FIG. 6 is a schematic diagram of a circuit arrangement for the structure of FIG. 5.

DESCRIPTION OF THE PREFERRED EMBODIMENTS

Referring now to FIG. 1 there is illustrated a simplified model of a forward active transistor having an emitter region 11, a base region 12, and a collector region 13, with a metallurgical junction 14 between the emitter and base and a second metallurgical junction 15 between the base and collector. With voltages applied to the junctions, space-charge layers 16 and 17 are formed at the emitter-base junction and the collector-phase junction, respectively, and the distance 18 between these two space-charge layers is the "effective" base width. The minority carrier distribution in the base is depicted as a sloping line 19 between the space-charge layer 16 of the emitter-base junction and the space charge layer 17 of the collector-base junction.

The minority carriers moving through the base region determine the extent of the collector current ($I_c$) flow. The minority carrier concentration is constrained to zero at the space charge layer of the base-collector junction while the minority carrier concentration at the space-charge layer at the emitter-base junction is directly dependent on the emitter-base voltage. Therefore, by changing the emitter-base voltage with the collector-base voltage held constant, the minority carrier distribution can be changed, i.e. the slope of line 19 is changed, an increased voltage producing a steeper slope and a decreased voltage producing a lesser slope. On the other hand, by leaving the emitter-base voltage fixed, and by moving the collector-base junction further away from the emitter base junction, the minority carrier distribution, as represented by the sloping line 19, and thus the collector-current $I_c$ can be proportionately reduced. By moving the collector-base junction closer to the emitter-base junction, the slope of line 19 and thus the collector current $I_c$ can be increased proportionately. In other words, if the base-emitter voltage is kept constant, the collector current, $I_c$, is a function of the effective base width 18 of the transistor.

This effect can be utilized by fabricating two or more separate transistors with different effective base widths, and by tying the emitters together and the base regions together, such that the emitter-base voltages for the separate devices are equal. Because the effective base widths differ for the different devices, the collector currents in the different devices will likewise differ; the transistor with the shortest effective base width will draw more current than a transistor with a greater effective base width, and the ratios of these $I_c$ currents will be determined by the ratio of the effective base widths.

A structure of this type is shown in plane view in FIG. 2 and schematic view in FIG. 3 where four similar transistors 21, 22, 23 and 24 are shown fabricated on a single substrate 25, the transistors differing only in their base widths, the base widths increasing for each transistor 21 through 24, respectively. These different base widths are produced by the masking in the fabrication of a lateral transistor and are thus just a function of mask geometry. Each transistor comprises an emitter 26 of P type material, a P type collector 27, and an N+ type base contact region 28, all formed in a well known manner by diffusion in a base region formed by an N type epitaxial layer on a common substrate. Suitable isolation barriers 29 of P type material are formed about each transistor.

As shown in the schematic diagram of FIG. 3, the base regions for the four devices are tied together as are the emitter regions, and a common emitter-base voltage is applied. By tying the collector and base together for one of the transistors, for example transistor 21, a reference current $I_{REF}$ is established through transistor 21, and the other currents $I_1$ through transistor 22, $I_2$ through transistor 23, and $I_3$ through transistor 24, are proportionately related to current $I_{REF}$ and to each other, dependent on the effective base widths of the transistors. Thus current scaling can be readily accomplished in these lateral transistors.

Referring now to FIG. 4 there is shown a transistor structure wherein base width scaling as described above is combined with sector scaling to provide current scaling dependent on the two different effects. In this plan view there is shown a single P type emitter 31 and single N+ type base contact region 32 common to four separate P type collectors 33–36. The collectors are formed as arcs of circles about the common emitter positioned on the axis of this circular geometrical pattern. Now two degrees of freedom are afforded to the circuit designer in proportioning the current flow from the common emitter through the separate collectors; one variable is the length of arc of a particular collector and the second variable is the base width 37 for each collector, i.e. the radial distance from the common emitter to the particular collector. The limit on this type of sector-base width scaling combination is set mainly by the collector size needed to form a good electrical contact with a metallic connector on the surface of the substrate.

Another embodiment of this invention is shown in plan view in FIG. 5 and in schematic view in FIG. 6 wherein very large ratios of current scaling can be obtained, for example current ratios of 2000:1 or more. A pair of collector segments 41 and 42 are formed, each segment forming almost a semi-circle about the common emitter 43 equally spaced radially from the emitter 43. A pair of gaps 44 and 45 or apertures are thus formed between the ends of these two collector segments 41, 42. The two collectors can then be tied together by a suitable interconnection (not shown) such that they form one base-collector circuit. A first additional collector 46 is formed on the arc of a larger circle, this first additional collector 46 being aligned with the first gap 44 and having a base width which is greater than that formed between the common emitter 43 and the common collectors 41, 42. A second additional collector 47 is formed on the arc of a circle larger than that of the first additional collector 46, this second additional collector 47 being aligned with the second gap region of the common collectors. Thus, the base width of the second additional collector 47 is greater than the base width of the first additional collector 46. A single base contact region 48 is provided.

These two apertures 44 and 45 will tend to modulate the current passing between the emitter 43 and the two associated collectors 46 and 47, so that in use the collector segments 41, 42 are tied to the base region by a suitable interconnect (not shown) to keep the effective aperture sizes fixed.

It should be understood that the aperture limited structure could employ only two collectors, one almost encircling the emitter with a small gap between its ends, and the other collector being positioned outside the gap and in alignment with the emitter.

What is claimed is:

1. A lateral transistor structure formed in a semiconductive substrate comprising:
    a plurality of separate lateral transistors formed in said substrate, each of said transistors including:
        a base region of a first conductivity type formed in the surface of the substrate, the base regions for the transistors being electrically coupled together,
        an emitter region of a second conductivity type formed in said base region, and
        a collector region of a second conductivity type formed in said base region and spaced from said emitter region such that the distance between each said collector region and its associated emitter region for each transistor is a constant dimension over the length of said associated collector region, said distance forming a base width between said emitter region and each said associated collector region, the base widths of the different transistors being different, and
    means for coupling said emitter regions in common to apply a common emitter-base voltage thereto, whereby the collector currents in said different collector regions for the different transistors are a function of the different base widths of said different transistors.

2. A lateral transistor structure as claimed in claim 1 including means electrically coupling the collector region of one of said transistors in common with its base region.

3. A lateral transistor structure formed in a semiconductive substrate comprising:
    a common base region of a first conductivity type formed in the surface of the substrate, a common emitter region of a second conductivity type formed in said base region, and a plurality of collector regions of a second conductivity type formed in said base region as arc segments around said emitter region, the distance between each collector region and the common emitter region being a constant radius over the length of said collector region, said distance forming a base width between emitter region and collector region, the base width for a certain one of said collector regions being different than the base width for another one of said collector regions, and means for applying a common emitter-base voltage thereto, whereby the collector currents in said different collector regions are a function of the base widths for said different collector regions.

4. A lateral transistor as claimed in claim 3 including means electrically coupling one of said collector regions to said base region.

5. A lateral transistor as claimed in claim 3 wherein one of said collector regions forms a gap between two of its ends, and another of said collector regions is positioned on the opposite side of said gap from said emitter region and in alignment with said emitter region and said gap, the base width of said other collector region being greater than the base width of said one collector region.

6. A lateral transistor as claimed in claim 5 including means electrically coupling one of said collector regions to said base region.

7. A lateral transistor structure as claimed in claim 3 wherein said first conductivity type is N type and said second conductivity type is P type.

8. A lateral transistor structure as claimed in claim 1 wherein said first conductivity type is N type and said second conductivity type is P type.

* * * * *